(12) United States Patent
Kirker et al.

(10) Patent No.: US 7,222,243 B2
(45) Date of Patent: May 22, 2007

(54) POWER DELIVERY SYSTEM FOR A MICROPROCESSOR

(75) Inventors: Robert A. Kirker, Harrisburg, PA (US); Brian P. Costello, Scotts Valley, CA (US)

(73) Assignee: Tyco Electronics Corporation, Middletown, PA (US)

( * ) Notice: Subject to any disclaimer, the term of this patent is extended or adjusted under 35 U.S.C. 154(b) by 1350 days.

(21) Appl. No.: 09/843,601

(22) Filed: Apr. 26, 2001

(65) Prior Publication Data

US 2002/0162039 A1 Oct. 31, 2002

(51) Int. Cl.
G06F 1/26 (2006.01)

(52) U.S. Cl. .................. 713/300; 361/601

(58) Field of Classification Search ............... 713/300, 713/320, 330, 340; 363/147, 164; 361/601
See application file for complete search history.

(56) References Cited

U.S. PATENT DOCUMENTS

| | | | | |
|---|---|---|---|---|
| 4,649,417 A | * | 3/1987 | Burgess et al. | 323/311 |
| 5,599,913 A | | 2/1997 | Harris et al. | |
| 5,864,478 A | | 1/1999 | McCutchan et al. | |
| 5,870,290 A | * | 2/1999 | Chun et al. | 361/790 |
| 5,871,842 A | | 2/1999 | Crotzer et al. | |
| 5,949,029 A | | 9/1999 | Crotzer et al. | |
| 5,959,848 A | * | 9/1999 | Groves et al. | 361/809 |
| 5,977,489 A | | 11/1999 | Crotzer et al. | |
| 5,980,267 A | | 11/1999 | Ayers et al. | |
| 6,089,925 A | | 7/2000 | Maltais et al. | |
| 6,709,277 B2 | * | 3/2004 | Ruttan et al. | 439/66 |

FOREIGN PATENT DOCUMENTS

DE 198 56 083 A1 6/2000

* cited by examiner

Primary Examiner—Dennis M. Butler

(57) ABSTRACT

A power delivery system delivers a relatively constant voltage to a microprocessor with low inductance and low resistance. The system includes a motherboard, an integrated circuit (IC) mounted on one side of the motherboard, a capacitor bank mounted on the opposite side of the motherboard; and a power converter mounted on the side of the motherboard opposite the IC. The IC contains a microprocessor that receives power from the power converter and capacitor bank. A short electrical path between components is achieved by locating the power converter and the capacitor bank on the side of the motherboard opposite the IC. By shortening the electrical path, the system reduced the inductance and resistance created by the electrical traces. The components of the system are compressed together. Instead of utilizing long traces or specialized parts to connect the power converter to the motherboard, a compressive interface is positioned between the power converter, the capacitor bank and the motherboard. The compressive interface includes conductive materials that facilitate the flow of electricity between the various components. The compressive interface prevents excessive inductance and resistance between the power converter, the capacitor bank, and the motherboard.

34 Claims, 4 Drawing Sheets

POWER DELIVERY SYSTEM FOR A MICROPROCESSOR

BACKGROUND OF THE INVENTION

A preferred embodiment of the present invention generally relates to improvements in power delivery to electronic circuits and more particularly relates to an improved power delivery system for microprocessors.

Current microprocessors and associated integrated circuits typically require higher levels of power as compared to previous microprocessors and integrated circuits. Along with higher power requirements, current microprocessors typically draw higher currents. For example, many microprocessors require approximately 100 amps of current to function properly. Additionally, modem microprocessors switch currents at very fast rates, such as from 0 amps to 100 amps in 1 microsecond or less. Overall, because modem microprocessors operate at high speeds, they typically require greater amounts of power than previously required.

Typically, microprocessors operate at relatively low voltages, for example 3.3 volts, while continuing to operate at faster speeds. The increased capability and speed of these microprocessors, however, consumes a large amount of power despite the low voltage requirement. The low voltage requirement of current microprocessors typically requires a localized power converter, such as a dc-to-dc converter, to reduce the voltage supplied to the motherboard on which the microprocessor is located. Typically, the power converter is soldered to the motherboard or plugged into the motherboard via a connector. The lower voltage is then conducted through conductors or printed circuit traces on the motherboard to a connector of the component requiring the lower voltage, such as a microprocessor.

Many power delivery systems and power converters are mounted on a board or module. The module or board is then plugged into a connector on the motherboard. Because the voltage required by the microprocessor is lower, and the power consumption is high, the currents that are supplied to the module become particularly large. Consequently, a low inductance, low resistance path from the power converter to the motherboard is difficult to establish.

The microprocessor, however, requires a minimum power level to operate. Typically, if the voltage supplied to the microprocessor drops below a certain voltage, the microprocessor does not function properly. Because of the resistance caused by long traces on the motherboard, the voltage at the power converter is typically greater than that supplied to the microprocessor via the traces. Additionally, because the current through the traces switches at a fast rate, the long traces typically yield high inductance. That is, the faster the change in current, the more the voltage at the microprocessor will drop during that change. Fast rates of current change through long traces produce high voltage change. As switching speeds increase, the voltage at the microprocessor decreases. As the voltage at the microprocessor decreases, the performance of the microprocessor decreases.

A system has been proposed that attempts to address the problems associated with resistance and inductance in integrated circuits and microprocessors by locating the power converter adjacent to the microprocessor. The microprocessor typically includes a receptacle tab that interfaces with a connector located on the power converter. The power converter is connected to the motherboard via another connector that supplies power to the power converter. The power converter then converts the power and supplies the converted power to the microprocessor via the power converter connector. The microprocessor receives the converted power via the receptacle tab.

However, a suitable motherboard connector is required along with the power converter, and specialized interface components including at least a power converter connector, and a microprocessor receptacle tab. This system is typically more expensive than other systems due to the additional components utilized. Further, this system poses problems when components require maintenance and repair. Because additional, specialized parts and components are used, alternative components typically cannot be substituted when one of the specialized parts breaks. Additionally, the presence of various components may diminish the reliability of the system. Each additional component and part is susceptible to failure. Typically, if one component or part fails, the entire system fails. Therefore, the presence of more components and parts typically increases the risk of system failure.

A need remains for an improved power delivery apparatus and system for electronic circuits and microprocessors in particular. Further, a need also exists for a less expensive power delivery system. Additionally, a need has long existed for a more reliable power delivery system and for a more readily interchangeable power delivery system.

BRIEF SUMMARY OF THE INVENTION

At least one preferred embodiment of the present invention relates to a system for providing a relatively constant voltage to a microprocessor with low inductance and low resistance. The system includes a motherboard, an integrated circuit (IC) mounted on one side of the motherboard, a capacitor bank mounted on the opposite side of the motherboard; and a power converter mounted on the side of the motherboard opposite the IC. The IC contains a microprocessor that receives power from the power converter and capacitor bank. A short electrical path between the IC, power converter and capacitor bank is achieved by locating the power converter and the capacitor bank on the side of the motherboard opposite the IC. By shortening the electrical path, the system reduces the inductance and resistance created by the electrical traces.

The components of the system are compressed together to electrically communicate through a compressive interface. Instead of utilizing long traces or specialized parts to connect the power converter to the motherboard, a compressive interface is utilized between the power converter, capacitor bank and printed circuit board. The compressive interface includes conductive materials that facilitate the flow of electricity between the various components. The compressive interface prevents excessive inductance and resistance between the power converter, the capacitor bank, and the motherboard.

Figure 1:
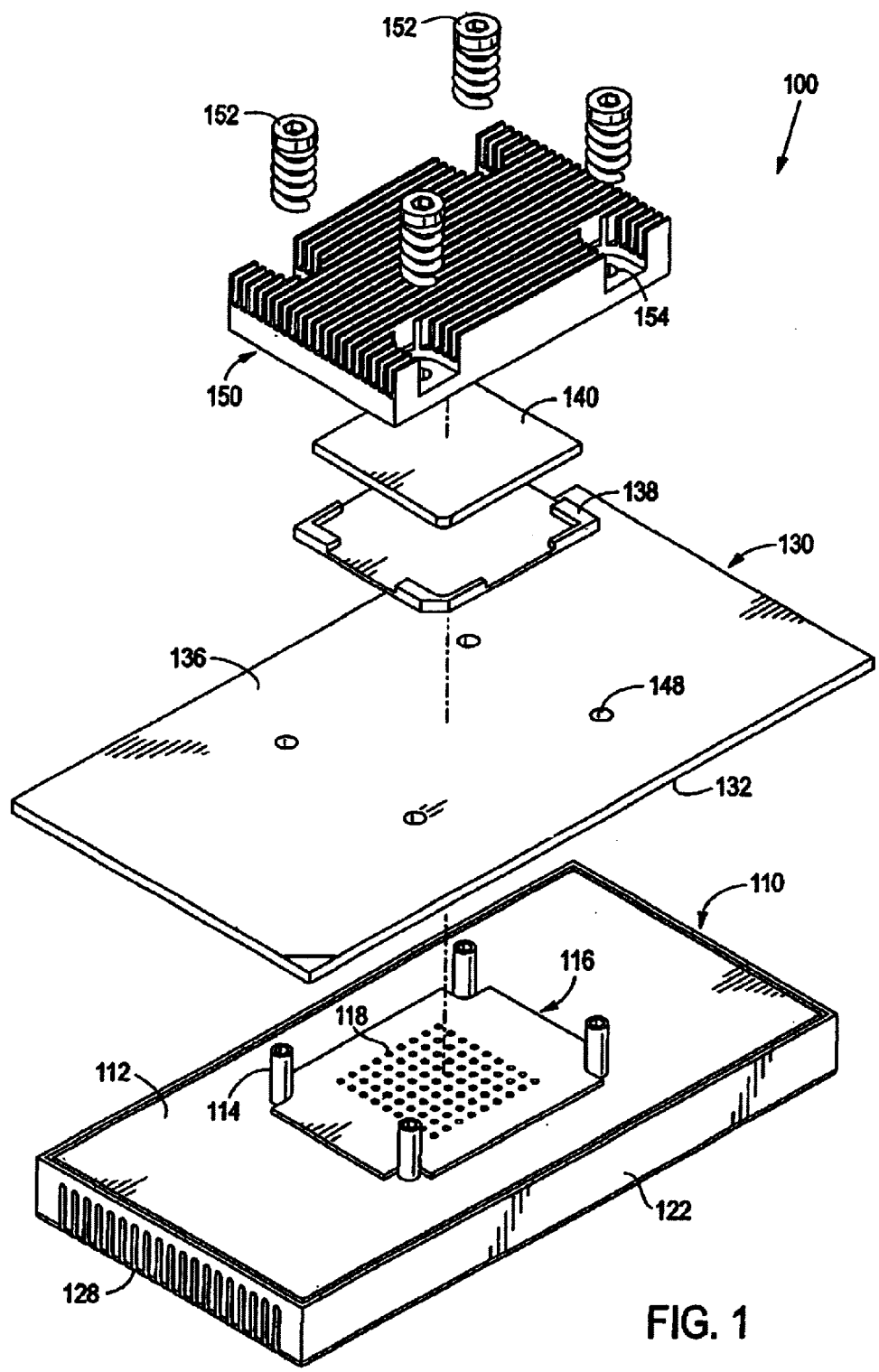
FIG. 1 illustrates an exploded, top view of a power module system formed in accordance with a preferred embodiment of the present invention.

The foregoing summary, as well as the following detailed description of the preferred embodiments of the present invention, will be better understood when read in conjunction with the appended drawings. For the purpose of illustrating the invention, there is shown in the drawings, embodiments which are presently preferred. It should be understood, however, that the present invention is not limited to the precise arrangements and instrumentality shown in the attached drawings.

DETAILED DESCRIPTION OF THE INVENTION

FIG. 1 illustrates an exploded, top view of a power module system 100 formed in accordance with a preferred embodiment of the present invention. The power module system 100 includes a power converter 110, a motherboard 130, and a heat sink 150 that includes heat sink screws 152 and fastener openings 154 located about the perimeter of the heat sink 150. The power converter 110 supports the motherboard 130, which in turn supports the heat sink 150.

Figure 2:
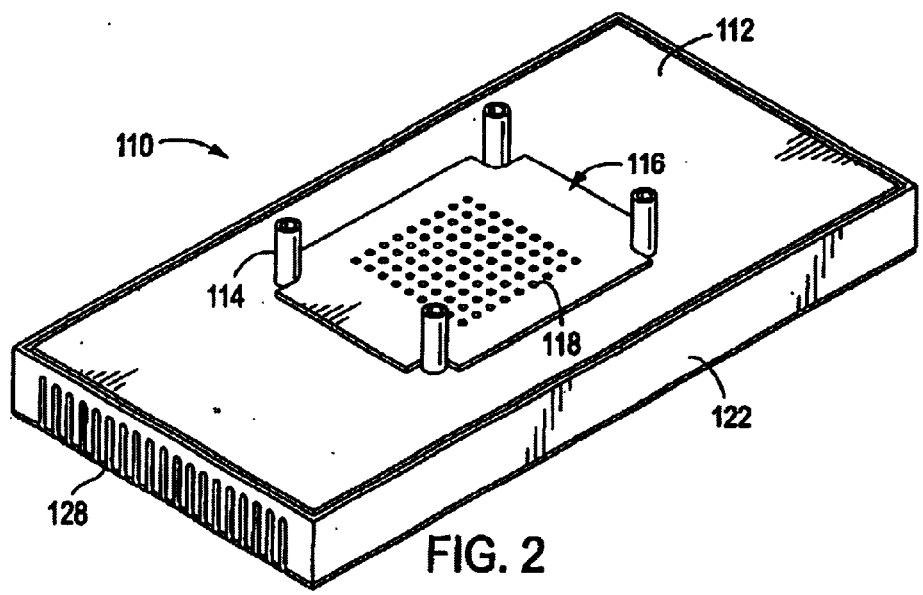
FIG. 2 illustrates a top view of a power converter formed in accordance with a preferred embodiment of the present invention.

FIG. 2 illustrates a top view of the power converter 110 formed in accordance with a preferred embodiment of the present invention. The power converter 110 includes a power converter top surface 112 with heat sink mounting standoffs 114 extending upward therefrom. The standoffs 114 are arranged to align with openings 148 through the motherboard 130 and openings 154 in the heat sink 150. When assembled, the standoffs 114 threadably engage the heat sink screws 152 to form a compressive connection between the heat sink 150 and the power converter 110. The power converter 110 also includes a compressive interface 116, a power connector cover 122, and side vents 128. The compressive interface 116 is located on the top surface 112 of the power converter 110 and is compressed flush with the top surface 112 to enable the power converter 110 to compress, or abut substantially flush, against one side of the motherboard 130. Alternatively, the compressive interface 116 may be counter sunk to reside flush with the top surface 112. Optionally, the compressive interface 116 may be centered between the mounting standoffs 114 to ensure that an even force is applied to the compressive interface 116. The compressive interface 116 includes power converter contacts 118 that are aligned, optionally, in rows and columns. The power converter contacts 118 may include input power pins, output power pins, and control input/output lines. The power converter 110 is further described below with respect to FIGS. 3 and 4.

Referring again to FIG. 1, the motherboard 130 includes a motherboard second side 132, a motherboard first side 136 and mounting stud openings 148 arranged to align with the mounting standoffs 114. The motherboard first side 136 includes an integrated circuit (IC) socket 138 that retains an IC 140. The IC socket 138 includes power supply contacts that may include input and output pins that extend downward from the socket 138 and connect to the motherboard 130 through vias located on the motherboard. Alternatively, the motherboard 130 may include through holes that allow input and output pins from the socket 138 to project from an opposite side of the motherboard 130 (second side 132). The IC 140 is secured onto the motherboard via the IC socket 138. The IC 140 contains a microprocessor (not shown) that may be connected to the circuit board of the IC 140 via a Land Grid Array (LGA), a Pin Grid Array (PGA), a Ball Grid Array (BGA) and the like.

The IC 140 is connected to the motherboard 130 via the IC socket 138. Preferably, the IC socket 138 is a compressible piece of plastic with columns of conductive material that provide electrical paths between the IC 140 and the motherboard 130, such as Tyco Electronic Inc.'s MPI interface. Alternatively, the IC socket 138 may be another compressible material that conducts electricity. Vias located on the motherboard 130 electrically connect the motherboard first side 136 to the motherboard second side 132. As the IC 140 is connected to the motherboard 130, the vias, such as plated through vias, extend through the motherboard first side 136 and connect to pads on the motherboard second side 132. The pads on the motherboard second side 132 are positioned to line up with the compressive interface 116 of the power converter 110.

Alternatively, once the IC 140 is connected to the motherboard 130 via the IC socket 138, power supply contacts of the IC 140 may be received by the compressive interface 116 of the power converter 110. As the IC 140 is connected to the motherboard 130, the power supply contacts of the IC 140 extend through the motherboard first side 136 and project from the motherboard second side 132. Because the power supply contacts extend out from the motherboard second side 132, the power supply contacts are capable of being received by the compressive interface 116 of the power converter 110.

The motherboard 130 is mounted on top of the power converter 110. The mounting stud openings 148 of the motherboard 130 allow the motherboard second side 132 to compress the compressive interface 116 against the power converter top surface 112. As the motherboard second side 132 comes into contact with the compressive interface 116 and compresses against the power converter top surface 112, the compression electrically connects the motherboard second side 132 to the power converter top surface 112. The power converter contacts 118 of the compressive of the compressive interface 116 are aligned to pads on the motherboard second side 132 and pads on the power converter top surface 112. Alternatively, the power converter contacts 118 of the compressive interface 116 may be formed to align with, and accept, power supply contacts located on the IC 140. Preferably, the compressive interface 116 is a compressible plastic with columns of conductive material that provide an electrical path between the power converter 110 and the motherboard. Alternatively, the compressive interface 116 may be another compressive-type interface such as a shorting-v contact or a micro-spring™ contact.

Once the motherboard 130 is connected to the power converter 110, the heat sink 150 is placed on top of the IC 140. The fastener openings 154 of the heat sink 154 allow the heat sink 150 to slide down the heat sink mounting standoffs 114 and come into direct contact with the IC 140. After the heat sink 150 is positioned on the IC 140, the heat sink 150 is mounted via the heat sink screws 152. The heat sink screws 152 are received by the heat sink mounting standoffs 114 which extend toward the heat sink 150 through the motherboard 130 via the mounting stud openings 148 and into the heat sink via the fastener openings 154. After the heat sink 150 has been positioned on the IC 140, which is in turn positioned on the power converter 110, the heat sink screws 152 are positioned over the fastener openings 154 and onto the heat sink mounting standoffs 114. The heat sink screws 152 threadably fasten the heat sink 150 to the IC 140.

Because the heat sink mounting standoffs 114 are positioned on the power converter top surface 112, fastening the heat sink 150 to the heat sink mounting standoffs 114 compresses the heat sink 150 and the power converter 110 together while also compressing the IC 140 and the IC socket 138 together. The motherboard 130 is compressed between the heat sink 150 and the power converter 110. That is, the motherboard second side 132 is compressed into the heat sink 150 while the motherboard first side 136 is compressed into the power converter top side 112.

In operation, the power converter 110 receives power from a power supply (not shown) at a first D.C. voltage. The power converter 110 receives the first D.C. voltage through the compressive interface 116. The power converter 110 converts the first D.C. voltage to a second D.C. voltage which is provided to the IC 140 through the compressive interface 116. That is, the power converter contacts 118 of the compressive interface 116 transfer the second D.C. voltage to the adjoining power supply contacts 142 of the IC 140. The heat sink 150 receives the excess heat produced by the IC 140.

The location of the power converter 110 in relation to the IC 140 provides a short electrical path between the power converter 110 and the IC 140. The short electrical path between the power converter 110 and the IC 140 provides power to the microprocessor located in the IC 140 at high current with low inductance and low resistance.

Figure 3:
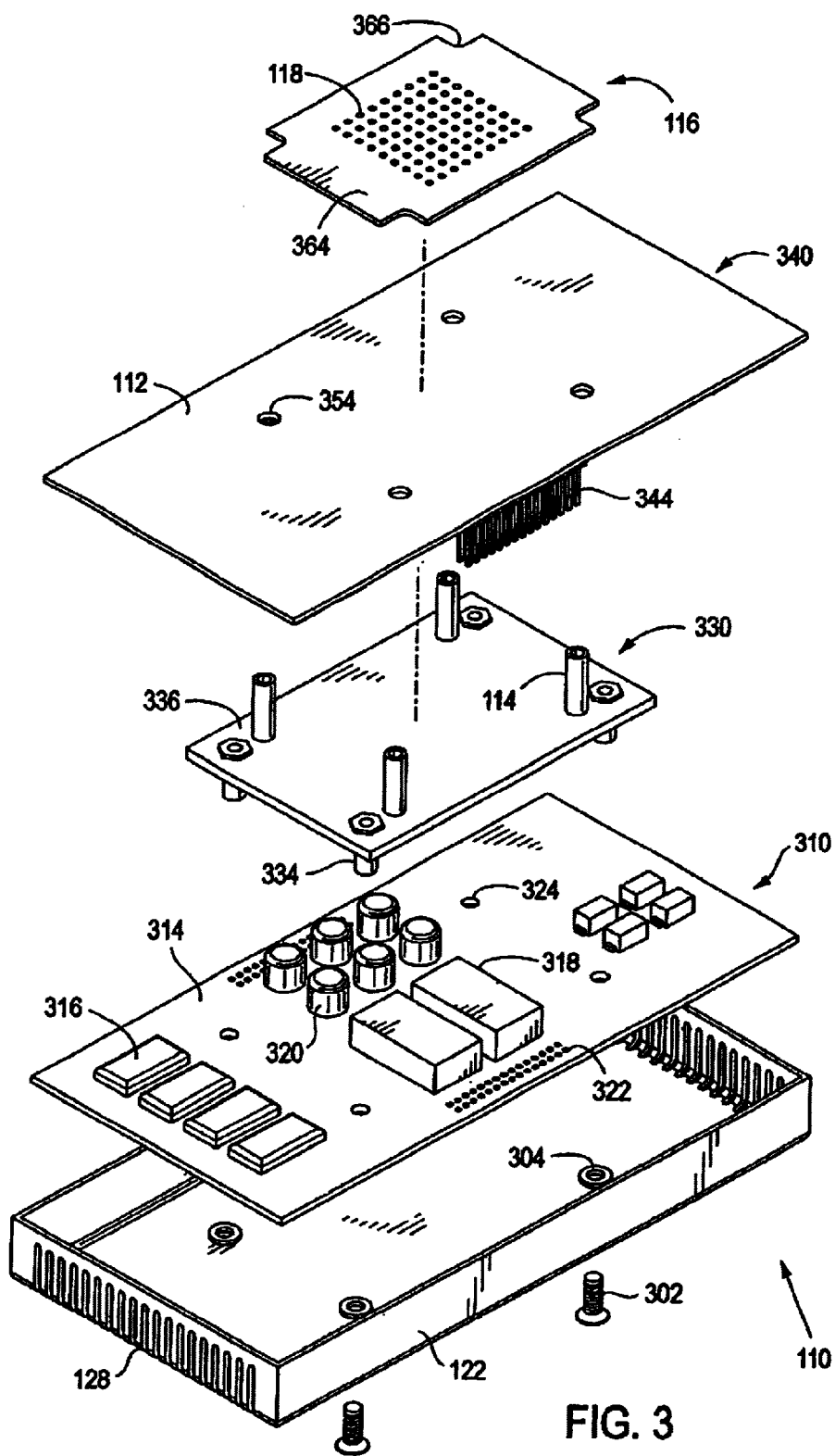
FIG. 3 illustrates an exploded, top view of a power converter formed in accordance with a preferred embodiment of the present invention.
Figure 4:
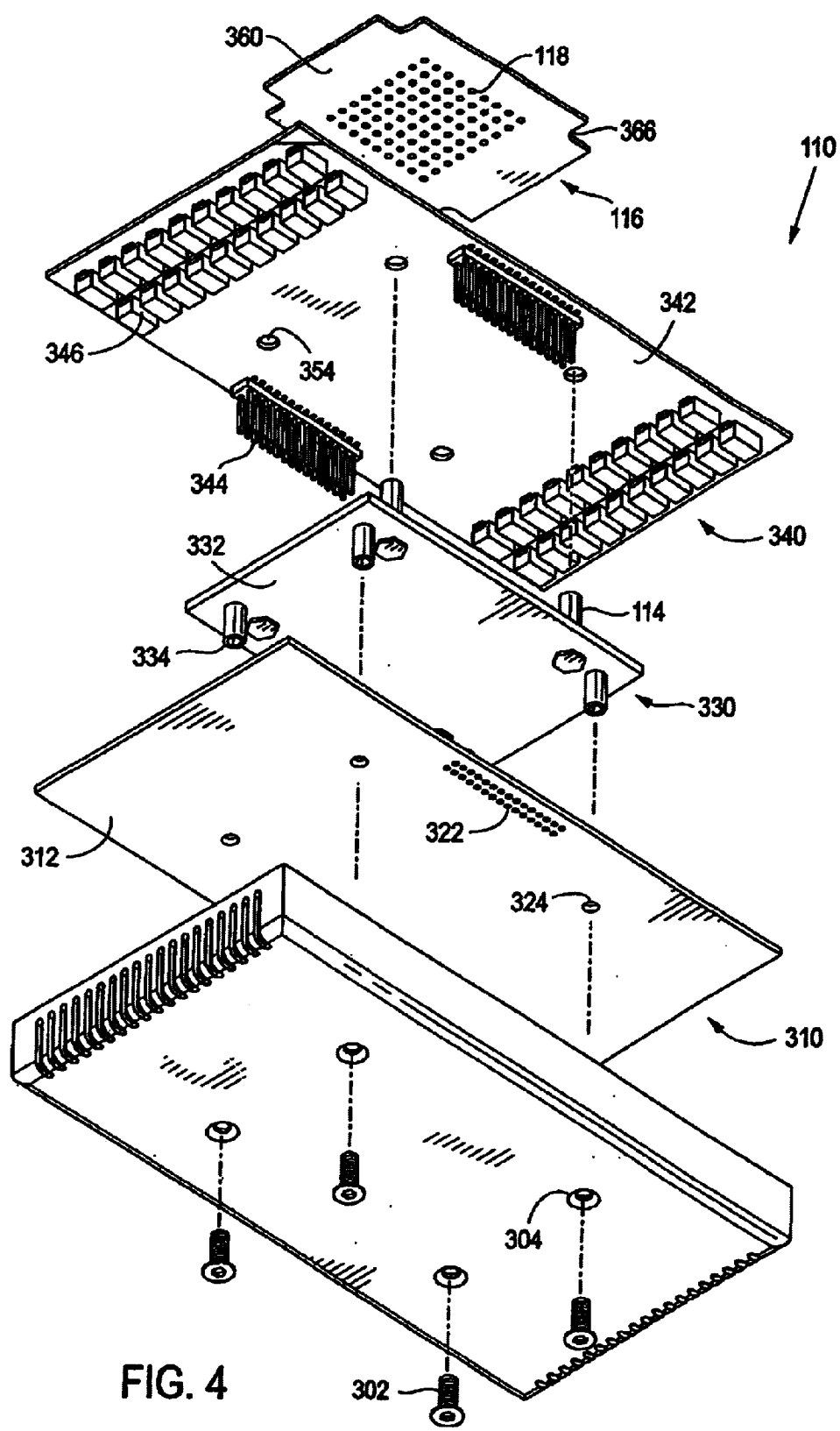
FIG. 4 illustrates an exploded, bottom view of a power converter formed in accordance with a preferred embodiment of the present invention.

FIG. 3 illustrates an exploded, top view of a power converter 110 formed in accordance with a preferred embodiment of the present invention. The power converter 110 includes a cover 122 having cover holes 304, a main printed circuit board 310, a backer plate 330, a capacitor printed circuit board 340 and the compressive interface 116. FIG. 3 shows the main printed circuit board first side 314, the backer plate first side 336, the power converter top surface 112, and the compressive interface first side 364. FIG. 4 is an exploded, bottom view of a power converter 110 formed in accordance with a preferred embodiment of the present invention. FIG. 4 shows the second side 312 of the main printed circuit board 310, the second side 332 of the backer plate 330, the second side 342 of the capacitor printed circuit board 340 and second side 360 of the compressive interface 116.

The main printed circuit board 310 includes a second side 312, a first side 314 and holes 324 that allow for the passage of the cover screws 302. The first side 314 includes semiconductors 316, step down transformers 318, capacitors 320 and interconnect receptacles 322 mounted thereto.

Figure 5:
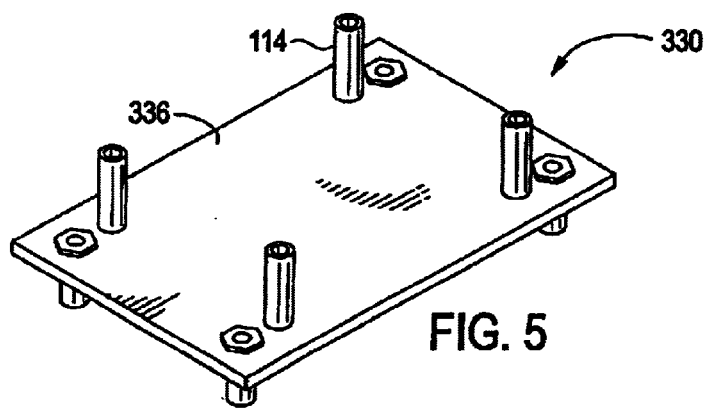
FIG. 5 illustrates a top view of a backer plate formed in accordance with a preferred embodiment of the present invention.
Figure 6:
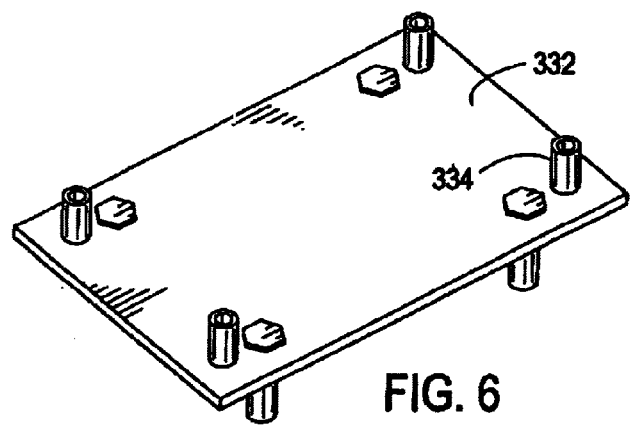
FIG. 6 illustrates a bottom view of a backer plate formed in accordance with a preferred embodiment of the present invention.

FIGS. 5 and 6 illustrates the backer plate 330 in more detail. The backer plate 330 includes a first side 336 and a second side 332. The second side 332 of the backer plate 330 includes cover mounting standoffs 334. The first side 336 of the backer plate 330 includes the heat sink mounting standoffs 114.

The capacitor printed circuit board 340 includes a second side 342, the power converter top surface 112 and holes 354 that allow for the passage of the cover screws 302. The second side 342 of the capacitor printed circuit board 340 includes interconnects 344 and capacitor banks 346 extending therefrom. The power converter top surface 112 includes traces 352. The compressive interface 116 includes a second side 360, a first side 364 having power converter contacts 118, and notches 366 that allow for the passage of the heat sink mounting standoffs 114.

The cover 122 supports the main printed circuit board 310. The backer plate 330 is positioned between the main printed circuit board 310 and the capacitor printed circuit board 340. The backer plate 330 ensures that the power converter 110 is held together securely.

The cover mounting standoffs 334 of the backer plate 330 extend through the main printed circuit board 310 via the holes 324 to the cover 122. The cover mounting standoffs 334 align with the cover holes 304. The cover mounting standoffs 334 receive the cover screws 302 which engage the cover mounting standoffs 334 through the cover holes 304. The cover screws 302 ensure that the backer plate 330 is secured to the cover 122. Because the main printed circuit board 310 is positioned between the backer plate 330 and the cover 122, the main printed circuit board 310 is secured within the cover 122 as the cover mounting standoffs 334 of the backer plate 330 are securely fastened to the cover 122 via the cover screws 302.

The heat sink mounting standoffs 114 of the backer plate 330 extend through the capacitor printed circuit board 340 via the holes 354. The heat sink mounting standoffs 114 extend through the holes 354 up through the notches 366 of the compressive interface 116. The notches 366 of the compressive interface 116 are positioned so that the compressive interface 116 abuts each of the heat sink mounting standoffs 114 and fits securely within the region bounded by the heat sink mounting standoffs 114. Because the capacitor circuit board 340 is positioned between the backer plate 330 and the compressive interface 116, the capacitor circuit board 340 mounts securely between the backer plate 330 and the compressive interface 116 as the compressive interface 116 is secured by the heat sink mounting standoffs 114 via the notches 366.

The capacitor printed circuit board 340 is electrically connected to the main printed circuit board 310 via the interconnect receptacles 322 which receive the interconnects 344 of the capacitor printed circuit board 340. The interconnects 344 are in turn electrically connected to traces 352 located on the power converter top surface 112. When the compressive interface 116 and the power converter top surface 112 are compressed together, the power converter contacts 118 of the compressive interface 116 contact the traces 352, thereby forming an electrical path between the compressive interface 116 and the power converter 110.

In addition to holding the power converter 110 together securely, the backer plate 330 also provides support for the power converter 110. The compression of the various components within the power converter 110 creates stresses and tensions within the power converter 110. Additionally, the placement of the motherboard 130 on top of the power converter 110 and the heat sink 150 on top of the motherboard 130 causes even more stress and tension on the power converter 110. The backer plate 330 provides physical support to the power converter 110 thereby preventing flexing and bowing of the power converter 110 under the stresses and tensions caused by the compression of the various components.

The semiconductors 316, step-down transformers 318, capacitors 320 and interconnect receptacles 322 are fastened to the first side 314 of the main printed circuit board 310, preferably, through solder connections. Additionally, the capacitor banks 346 and the interconnects 344 are preferably soldered to the second side 342 of the capacitor printed circuit board 340. The capacitor banks 346 of the capacitor printed circuit board 340 are located on the second side 342 of the capacitor printed circuit board 340 under the power converter top surface 112. The capacitor banks 346 are electrically connected to the traces 152, which are in turn electrically connected to the power converter contacts 118 when the compressive interface 116 and the power converter 110 are compressed together.

When the motherboard 130 is positioned adjacent and compressed against the power converter 110, the capacitor banks 346 are within close proximity of the IC 140. Optionally, the capacitor banks 346 may be located at the edges of the capacitor printed circuit board 340, not directly under the microprocessor of the IC 140. Alternatively, the capacitor banks 346 may be positioned directly under the microprocessor of the IC 140. That is, a middle section of the backer plate 330 may be cut out to provide space for the capacitor banks 346 to extend downward from the second side 360 of the capacitor printed circuit board 340.

In operation, the power converter 110 receives power from a power supply (not shown) at a first D.C. voltage. The power converter 110 receives the first D.C. voltage through the compressive interface 116. The first D.C. voltage travels through the power converter contacts 118 of the compressive interface 116 and through the traces 352 located on the power converter top surface 112. The interconnects 344 then receive the first D.C. voltage from the traces 352. Then, the interconnect receptacle 322 located on the main printed circuit board first side 314 receives the first D.C. voltage. The step down transformers 318 then receive the first D.C. voltage via traces (not shown) on the main printed circuit board first side 314. The step down transformers 318 then convert the first D.C. voltage to a second D.C. voltage. The semiconductors 316 control the logic and power input and output operations. The interconnect receptacle 322 then receives the second D.C. voltage via traces on the main printed circuit board first side 314. The interconnects 344 then receive the second D.C. voltage from the interconnect receptacle 322 and transfer the second D.C. voltage to the traces 352. The traces 352 then transfer the second D.C. voltage to the power converter contacts 118.

The power converter 110 is not fast enough to supply high current levels to the microprocessor of the IC 140 when the current is switched. Switching from low current to high current, for example 0 amps to 100 amps or higher, at very quick rates, such as 1 microsecond or faster, may preclude the power converter from providing a relatively constant voltage to the microprocessor of the IC 140. The capacitors of the capacitor banks 346 are utilized to maintain a relatively constant voltage at the IC 140. The capacitor banks 346 store energy received from the main printed circuit board 310. Energy from the main printed circuit board 310 travels from the interconnect receptacles 322 to the interconnects 344. The traces 352 then receive the energy from the interconnects 344 and then distribute the energy to the capacitors in the capacitor banks 346.

The capacitors of the capacitor banks 346 supply additional energy to the microprocessor of the ICU 140 during current switching. During the transient when the current is being switched from 0 to 100 amps, the energy stored in the capacitor banks 346 supply the extra energy need by the microprocessor of the IC 140. Preferably, the power converter 110 supplies power to the capacitor banks 346 at voltages between ½ volt to 2 volts. During the fast current transient, the capacitors in the capacitor banks 346 supply energy to the microprocessor of the IC 140 to maintain the voltage at the microprocessor until the power converter 110 can respond to recharge the capacitor banks 346 and provide a relatively constant voltage to the IC 140.

The capacitor banks 346 transfer energy to the power converter contacts 118 of the compressive interface 116 via the traces 352. The pads and vias of the motherboard 130 connect the power contacts located on the IC socket 138, which are in turn connected to the IC 140. Alternatively, power supply contacts 142 of the IC 140 may receive the energy from the power converter contacts 118 compressed against the power supply contacts 142. The transfer of energy from the capacitors of the capacitor bank 346 to the IC 140 maintains a relatively constant voltage supply at the IC 140 and the microprocessor within the IC 140. During the fast current switch, the output voltage to the IC 140 changes less than 5%. Therefore, the capacitor banks 346 prevent excessive change of the input voltage from the power supply to the IC 140.

Inductance and resistance are minimized due, in part, to the location of the power converter 110 underneath the IC 140. Because the power converter 110 and the microprocessor of the IC 140 are connected via short traces, the problems associated with inductance and resistance due to long traces are minimized. The close proximity of the power converter 110 and the capacitor banks 346 to the IC 140 allows high current switching with low inductance and resistance. The close proximity of the IC 140 and the microprocessor within the IC 140 to the power converter 110 and to the capacitors of the capacitor bank 346, shortens the distance of the traces among the IC 140, the power converter 110 and the capacitor bank 346. Shorter traces yield lower inductance and resistance.

Additionally, placing the capacitor banks 346 below the IC 140 provides better airflow to the IC 140. Because the capacitor banks 346 are located underneath the IC 140, the capacitor banks 346 do not block airflow to the microprocessor and other components of the IC 140. Therefore, by placing the capacitors below the IC 140, the area around the microprocessor is opened and more air flows around the IC 140 thereby cooling the IC 140. Consequently, because the IC 140 is cooled efficiently by airflow, a smaller, lighter, and lower cost hear sink 150 may be utilized to cool the IC 140.

Alternatively the capacitor banks 346 may be placed in various other positions. For example, the capacitor banks 346 may be placed on the outer edges of the first side 136 or second side 132 of the motherboard 130.

Additionally, the side vents 128 of the power converter 110 provide airflow inside the power converter 110. Because the air vents 128 are located on the sides of the power converter 110, the power converter 110 is supplied with a different air stream than the air stream surrounding the IC 140. That is, when power is supplied to the IC 140, the IC 140 heats the surrounding air and may cause additional thermal problems. The placement of air vents 128 on the sides of the power converter 110 provides two different air streams for thermal management: one air stream to the power converter 110; and the other air stream to the IC 140. Therefore, the power converter 110 is not cooled by an air stream heated by the IC 140.

While particular elements, embodiments and applications of the present invention have been shown and described, it will be understood, of course, that the invention is not limited thereto since modifications may be made by those skilled in the art, particularly in light of the foregoing teachings. It is therefore contemplated by the appended claims to cover such modifications that incorporate those features coming within the scope of the invention.

What is claimed is:

1. An apparatus for supplying power from a power supply to an integrated circuit mounted on a motherboard, the apparatus comprising:

a motherboard having first and second sides;
an integrated circuit (IC) mounted on said first side of said motherboard, said IC including IC power supply contacts;
a power converter mounted on said second side of said motherboard, said power converter receiving power from a power supply at a first D.C. voltage and converting said first D.C. voltage to a second D.C. voltage, said power converter including power converter contacts communicating with said IC power supply contacts to provide said second D.C. voltage to said IC.

2. The apparatus of claim 1, further comprising a heat sink mounted to said IC.

3. The apparatus of claim 1, further comprising an IC socket mounted on said first side of said motherboard and arranged to securely receive said IC.

4. The apparatus of claim 1, wherein said IC power supply contacts electrically connect from said first side through said motherboard to said second side and engage said power converter.

5. The apparatus of claim 1, wherein said power converter includes a capacitor bank receiving and storing power from said power converter, said capacitor bank providing power to said IC at said IC power supply contacts, said capacitor bank preventing excessive change of an input voltage of said power supply to said IC.

6. The apparatus of claim 1, wherein said power converter includes a top surface having a compressive interface arranged to compressibly adjoin said second side of said motherboard, said compressive interface including an array of at least one of contact receptacles and pads formed to align with pads on said motherboard.

7. The apparatus of claim 1, wherein said power converter includes a step-down transformer to convert said first D.C. voltage to said second D.C. voltage, a printed circuit board, and a plurality of capacitors and interconnects mounted on said printed circuit board, said interconnects joining said plurality of capacitors and said transformer.

8. The apparatus of claim 1, wherein said power converter includes a backer plate assembly to hold said power converter rigidly against said motherboard and to provide backing support to prevent flexing.

9. The apparatus of claim 1, wherein said power converter is mounted to said second side of said motherboard directly adjacent to said IC on said first side of said motherboard.

10. An apparatus for supplying power from a power converter to an integrated circuit mounted on a motherboard, the apparatus comprising:
a power converter;
a motherboard having first and second sides;
an integrated circuit (IC) mounted on said first side of said motherboard, said IC including IC power supply contacts;
a capacitor bank positioned proximate said second side of said motherboard, said capacitor bank receiving and storing power from said power converter, said capacitor bank providing power to said IC at said IC power supply contacts, said capacitor bank preventing excessive change in an input voltage of the power supplied to said IC.

11. The apparatus of claim 10, wherein said power converter is mounted on said second side of said motherboard, said power converter receiving power from a power supply at a first D.C. voltage and converting said first D.C. voltage to a second D.C. voltage, said power converter including power converter contacts communicating with said capacitor bank to provide said second D.C. voltage to said IC.

12. The apparatus of claim 10, further comprising a heat sink mounted to said IC.

13. The apparatus of claim 10, further comprising an IC socket mounted on said first side of said motherboard and arranged to securely receive said IC.

14. The apparatus of claim 10, wherein said IC power supply contacts electrically connect from said first side through said motherboard to said second side and engage said power converter.

15. The apparatus of claim 10, wherein said power converter includes a top surface having a compressive interface arranged to compressibly adjoin said second side of said motherboard, said compressive interface including an array of at least one of contact receptacles and pads formed to align with pads on said motherboard.

16. The apparatus of claim 10, wherein said power converter includes a step-down transformer to convert said first D.C. voltage to said second D.C. voltage, a printed circuit board, and a plurality of capacitors and interconnects mounted on said printed circuit board, said interconnects joining said plurality of capacitors and said transformer.

17. The apparatus of claim 10, wherein said power converter includes a backer plate assembly to hold said power converter rigidly against said motherboard and to provide backing support to prevent flexing.

18. The apparatus of claim 10, wherein said power converter is mounted to said second side of said motherboard directly adjacent to said IC on said first side of said motherboard.

19. An apparatus for supplying power from a power supply to an integrated circuit mounted on a motherboard, the apparatus comprising:
a motherboard having first and second sides;
an integrated circuit (IC) mounted on said first side of said motherboard, said IC including IC power supply contacts;
a capacitor bank mounted within close proximity of one of said first and second sides of said motherboard;
a power converter mounted on one of said first and second sides of said motherboard, one of said capacitor bank and power converter being mounted on said second side of said motherboard, said power converter receiving power from a power supply at a first D.C. voltage and converting said first D.C. voltage to a second D.C. voltage, said power converter including power converter contacts communicating with power input terminals of said capacitor bank to provide said second D.C. voltage to said capacitor bank, said capacitor bank receiving and storing power from said power converter, said capacitor bank providing power at said second D.C. voltage to said IC power supply contacts while preventing excessive change in said second D.C. voltage during high-speed power switching operations.

20. The apparatus of claim 19, wherein said capacitor bank is mounted directly on said first side of said motherboard.

21. The apparatus of claim 19, further comprising an IC socket mounted on said first side of said motherboard and arranged to receive said IC.

22. The apparatus of claim 19, wherein said IC power supply contacts electrically connect from said first side through said motherboard to said second side and engage said power converter.

23. The apparatus of claim 19, wherein said power converter includes a top surface having a compressive interface arranged to compressibly adjoin said second side of said motherboard, said compressive interface including an array of at least one of contact receptacles and pads formed to align with pads on said motherboard.

24. The apparatus of claim 19, wherein said power converter includes a step-down transformer to convert said first D.C. voltage to said second D.C. voltage, a printed circuit board, and a plurality of capacitors and interconnects mounted on said printed circuit board, said interconnects joining said plurality of capacitors and said transformer.

25. The apparatus of claim 19, wherein said power converter includes a backer plate assembly to hold said power converter rigidly against said motherboard and to provide backing support to prevent flexing.

26. The apparatus of claim 19 wherein said power converter is mounted on said second side of said motherboard directly across from said IC on said first side of said motherboard and said capacitor bank is mounted to said power converter.

27. The apparatus of claim 19 wherein said power converter is mounted on said first side of said motherboard directly adjacent said IC on said first side of said motherboard.

28. A system for providing a relatively constant voltage to a microprocessor with low inductance and low resistance, the system comprising:

a motherboard having first and second sides;

an integrated circuit (IC) mounted on said first side of said motherboard, said IC including IC power supply contacts;

a capacitor bank mounted on one of said first and second sides of said motherboard; and a power converter mounted on one of said first and said second sides of said motherboard, one of said capacitor bank and power converter being mounted on said second side of said motherboard, said power converter receiving power from a power supply at a first D.C. voltage and converting said first D.C. voltage to a second D.C. voltage, said power converter including:

power converter contacts communicating with power input terminals of said capacitor bank to provide said second D.C. voltage to said capacitor bank, said capacitor bank receiving and storing power from said power converter, said capacitor bank providing power at said second D.C. voltage to said IC power supply contacts while preventing excessive change in said second D.C. voltage during high-speed power switching operations; and a top surface having a compressive interface arranged to compressibly adjoin said second side of said motherboard, said compressive interface including an array of at least one of contact receptacles and pads formed to align with pads on said motherboard while preventing excessive inductance and resistance between said power converter, said capacitor bank, and said motherboard.

29. The system of claim 28, further comprising a heat sink mounted to said IC.

30. The system of claim 28, further comprising an IC socket mounted on said first side of said mother board and arranged to receive said IC.

31. The system of claim 28, wherein said power converter includes a step-down transformer to convert said first D.C. voltage to said second D.C. voltage, a printed circuit board, and a plurality of capacitors and interconnects mounted on said printed circuit board, said interconnects joining said plurality of capacitors and said transformer.

32. The system of claim 28, wherein said power converter includes a backer plate assembly to hold said power converter rigidly against said motherboard and to provide backing support to prevent flexing.

33. The system of claim 28 wherein said power converter is mounted to said second side of said motherboard directly adjacent said IC on said first side of said motherboard.

34. The system of claim 28 wherein said power converter is mounted on said first side of said motherboard directly adjacent said IC on said first side of said motherboard.

* * * * *